United States Patent
Kappel et al.

(10) Patent No.: US 12,321,137 B2
(45) Date of Patent: Jun. 3, 2025

(54) TIME-TO-DIGITAL CONVERTER

(71) Applicant: ams International AG, Jona (CH)

(72) Inventors: Robert Kappel, Wettmannstätten (AT); Daniel Furrer, Gebenstorf (CH); Manfred Lueger, Preding (AT); Yiming Jiang, Graz (AT); Hesong Xu, Rueschlikon (CH); Daniele Perenzoni, Adliswil (CH)

(73) Assignee: AMS INTERNATIONAL AG, Jona (CH)

( * ) Notice: Subject to any disclaimer, the term of this patent is extended or adjusted under 35 U.S.C. 154(b) by 172 days.

(21) Appl. No.: 18/043,113

(22) PCT Filed: Aug. 26, 2021

(86) PCT No.: PCT/EP2021/073601
§ 371 (c)(1),
(2) Date: Feb. 27, 2023

(87) PCT Pub. No.: WO2022/043431
PCT Pub. Date: Mar. 3, 2022

(65) Prior Publication Data
US 2023/0324853 A1    Oct. 12, 2023

(30) Foreign Application Priority Data
Aug. 28, 2020 (GB) ..................... 2013587

(51) Int. Cl.
*G04F 10/00* (2006.01)
*H04N 23/67* (2023.01)

(52) U.S. Cl.
CPC .......... *G04F 10/005* (2013.01); *H04N 23/67* (2023.01)

(58) Field of Classification Search
CPC .................................... H03M 1/502
See application file for complete search history.

(56) References Cited

U.S. PATENT DOCUMENTS 3,092,718 A * 6/1963 Wullert ................. H03M 1/485
377/17
8,525,092 B2 * 9/2013 Hagihara ............... H03K 21/00
341/155

(Continued)

OTHER PUBLICATIONS

International Search Report and Written Opinion dated Nov. 30, 2021, PCT Application No. PCT/EP2021/073601, 13 pages.

(Continued)

*Primary Examiner* — Lam T Mai
(74) *Attorney, Agent, or Firm* — MH2 Technology Law Group LLP

(57) ABSTRACT

A time-to-digital converter circuit is disclosed, the time-to-digital converter circuit including a plurality of delay stages connected to form a delay line, a plurality of event counters, an encoder circuit for triggering the delay line, and a binning circuit for associating an event with an event counter from plurality of event counters. The binning circuit selects the event counter based on a signal from the delay line, and wherein the encoder circuit is configured to sequentially trigger a different delay stage of the plurality of delay stages. Also disclosed is a time-of-flight sensor implementing the time-to-digital converter circuit, and an associated apparatus and method.

13 Claims, 14 Drawing Sheets

(56) References Cited

U.S. PATENT DOCUMENTS

| | | | | |
|---|---|---|---|---|
| 8,558,729 | B2* | 10/2013 | Tanaka | H04N 25/767 |
| | | | | 341/169 |
| 9,209,820 | B2* | 12/2015 | Familia | G04F 10/005 |
| 2007/0096836 | A1* | 5/2007 | Lee | H03L 7/085 |
| | | | | 331/57 |
| 2009/0195429 | A1* | 8/2009 | Chen | G04F 10/005 |
| | | | | 341/155 |
| 2010/0213999 | A1* | 8/2010 | Wiesbauer | G04F 10/005 |
| | | | | 327/276 |
| 2012/0229666 | A1* | 9/2012 | Hagihara | H04N 25/78 |
| | | | | 341/157 |
| 2012/0319883 | A1* | 12/2012 | Cao | G04F 10/005 |
| | | | | 341/155 |
| 2013/0063295 | A1* | 3/2013 | Hagihara | H04N 25/78 |
| | | | | 341/169 |
| 2015/0041625 | A1* | 2/2015 | Dutton | G01T 1/2985 |
| | | | | 341/166 |
| 2018/0088535 | A1* | 3/2018 | Wang | G04F 10/005 |
| 2018/0123611 | A1* | 5/2018 | Dutton | G01S 17/10 |
| 2021/0333402 | A1* | 10/2021 | Ronchini Ximenes | |
| | | | | G01S 7/4865 |

OTHER PUBLICATIONS

Kumar, P., "Time-of-Flight 3D Imaging based on a SPAD-TDC Pixel Array in Standard 65 nm CMOS Technology," Sep. 9, 2011, pp. 1-121, XP055598761, URL:http://resolver.tudelft.nl/uuid:340a1ab8-c9b6-443f-9f7c-122a3b61f4e6.
International Preliminary Report on Patentability dated Feb. 28, 2023, PCT Application No. PCT/EP2021/073601, 11 pages.

* cited by examiner

TIME-TO-DIGITAL CONVERTER

CROSS-REFERENCE TO RELATED APPLICATIONS

The present application is the national stage entry of International Patent Application No. PCT/EP2021/073601, filed on Aug. 26, 2021, and published as WO 2022/043431 A1 on Mar. 3, 2022, which claims the benefit of priority of Great Britain Patent Application No. 2013587.7, filed on Aug. 28, 2020, the disclosures of all of which are incorporated by reference herein in their entireties.

TECHNICAL FIELD OF THE DISCLOSURE

The present disclosure is in the field of time-to-digital converters, and particularly relates to time-to-digital converter circuits for use in time-of-flight sensors.

BACKGROUND

Devices, such as smartphones and tablet devices, may implement time-of-flight sensors for purposes of detecting a distance to a target. Such a determination of a distance may be useful, for example, for accurately adjusting a focus of a camera implemented on the device in order to enable focused imaging of targets at a range of distances from the camera.

Time-of-flight sensors may be implemented using one or more radiation-emitting elements configured to emit radiation towards a target. Such time-of-flight sensors may also implement one or more radiation-sensitive elements for detecting radiation reflected from the target. A time-of-flight measurement, e.g. a round-trip time for radiation emitted from the radiation-emitting element to be received at the radiation-sensitive element, may be indicative of a distance to the target.

In order to accurately determine a distance to the target, precise and accurate measurements of the time-of-flight are essential. Some time-of-flight sensors implement arrays of single-photon-avalanche-diodes (SPADs) for detecting reflected radiation. Such time-of-flight sensors may implement circuitry for indicating an intensity of reflected radiation that is detected by the SPAD array in particular time periods.

Some such time-of-flight sensors implement time-to-digital converters which may be configured to provide a digital representation of an elapsed time, and in some instances may be used to form histogram-based time-of-flight sensors.

Any errors in the digital representation of an elapsed time from the time-to-digital converter may affect an accuracy of a determination of a distance to a target. Time-to-digital converters are known to exhibit differential non-linearity errors which may be caused, at least in part, by mismatches between devices, propagation delays and other layout-dependent effects within the circuitry implementing the time-to-digital converters.

In order to address such issues, some prior art time-to-digital converters have been implemented using large devices to reduce the effect of device-mismatch. However, such large devices may increase an overall die size, incurring cost and increasing power consumption. Other prior art solutions may require complex circuitry or advanced post-processing of data to attempt to correct or compensate for errors that may be incurred due to device mismatch.

It is therefore desirable to provide an accurate, low-cost and low-complexity time-to-digital converter, suitable for use in time-of-flight sensors. Furthermore, it is also desirable to provide a method of reducing errors in such time-to-digital converters. It is therefore an aim of at least one embodiment of at least one aspect of the present disclosure to obviate or at least mitigate at least one of the above identified shortcomings of the prior art.

SUMMARY

The present disclosure is in the field of time-to-digital converters, and particularly relates to time-to-digital converters for time-of-flight sensors, such as those used for determining a distance to a target in camera based devices such as smartphones and the like.

According to a first aspect of the disclosure, there is provided a time-to-digital converter circuit comprising: a plurality of delay stages connected to form a delay line; a plurality of event counters; an encoder circuit for triggering the delay line; and a binning circuit for associating an event with an event counter from plurality of event counters. The encoder circuit is configured to sequentially trigger a different delay stage of the plurality of delay stages. The binning circuit selects the event counter based on a signal from the delay line. Advantageously, sequentially triggering a different delay stage of the plurality of delay stages avoids continually associating the same delay stage with the same event counter. As such, systematic errors that may be due to mismatches between components within the time-to-digital converter, which may be manifested as a differential non-linearity in the time-to-digital converter's performance, may be mitigated by averaging the effects of such errors across the plurality of event counters.

The encoder circuit may be configured to generate a first offset relative to a first stage of the delay line. The first offset may correspond to an entry point for a trigger to the delay line.

Advantageously, such an encoder provides a means to supplement existing delay-line based time-to-digital converter circuits without requiring a substantial re-design. That is, the vast majority of the circuitry of existing delay-line based time-to-digital converter circuits may remain unchanged, with only the trigger circuitry of the delay-line requiring modification to implement the encoder.

Furthermore, such an encoder may be implemented completely using digital circuitry, without requiring addition or modification of any analogue circuitry. As such, the encoder circuit may be readily applicable and portable to different technology nodes.

The encoder circuit may comprise a one-hot converter configured to convert an output from a counter to data corresponding to the first offset. For example, the one-hot converter may be a unary or a binary to one-hot converter. For example, the counter may be a binary counter and the converter may be a binary to one-hot converter.

The binning circuit may comprise a decoder circuit for generating a second offset for offsetting a selection of an event counter.

The encoder circuit may be configured to provide data to the decoder circuit. For example, the encoder circuit may be configured to provide an output of the counter to the decoder circuit. The second offset may be for compensating for the first offset. The second offset may have a same magnitude but opposite sign compared to the first offset, e.g. for a first offset of +31, the second offset may be −31.

The decoder may comprise multiplexer circuitry configured to associate detected events with any of the plurality of event counters. A configuration of the multiplexer circuitry may correspond to the second offset.

The binning circuit may comprise a thermometer to one-hot converter configured to convert the signal from the delay line to a signal for selecting a single event counter. For example, the binning circuit may comprise a unary-code to one-hot converter configured to convert the signal from the delay line to a signal for selecting a single event counter.

The plurality of event counters may be configured to correspond to a histogram memory. Each event counter may comprise a ripple counter, e.g. an n-bit ripple counter.

Each delay stage may comprise a delay element configured to receive a regulated current. A timing of the delay element may depend upon the regulated current. According to a second aspect of the invention there is provided a time-of-flight sensor comprising: an array of single photon avalanche diodes (SPADs); and at least one time-to-digital converter circuit according to the first aspect. The array of SPADs is coupled to the at least one time-to-digital converter circuit, and the at least one time-to-digital converter circuit is configured to associate SPAD-events with an event counter from the plurality of event counters.

The time-of-flight sensors may comprise a plurality of time-to-digital converter circuits; and a global delay-locked loop (DLL) configured to provide a control current to each of the plurality of time-to-digital converter circuits. A propagation delay of each delay stage may be defined by the control current.

According to a third aspect of the invention, there is provided an apparatus comprising: a time-of-flight-sensor according to the second aspect; a camera; and processing circuitry coupled to the time-of-flight-sensor and the camera. The processing circuitry may be configured to adjust a focus of the camera and/or adapt an image taken by the camera in response to a distance to a target determined by the time-of-flight-sensor.

The apparatus may be one of: a smartphone; a cellular telephone; a tablet; a laptop, or the like.

According to a fourth aspect of the invention, there is provided a method of reducing an error in a time-to-digital converter circuit comprising a delay line, a binning circuit and a plurality of event counters, wherein the method comprises:
configuring a trigger for a delay line to sequentially trigger a different delay stage of the delay line; and
configuring the binning circuit to select an event counter from a plurality of event counters based on a signal from the delay line.

The method may comprise a step of configuring a decoder circuit to generate an offset for offsetting a selection of an event counter.

The above summary is intended to be merely exemplary and non-limiting. The disclosure includes one or more corresponding aspects, embodiments or features in isolation or in various combinations whether or not specifically stated (including claimed) in that combination or in isolation. It should be understood that features defined above in accordance with any aspect of the present disclosure or below relating to any specific embodiment of the disclosure may be utilized, either alone or in combination with any other defined feature, in any other aspect or embodiment or to form a further aspect or embodiment of the disclosure.

BRIEF DESCRIPTION OF THE DRAWINGS

These and other aspects of the present disclosure will now be described, by way of example only, with reference to the accompanying drawings, wherein.

DETAILED DESCRIPTION OF THE PREFERRED EMBODIMENTS

Figure 1:
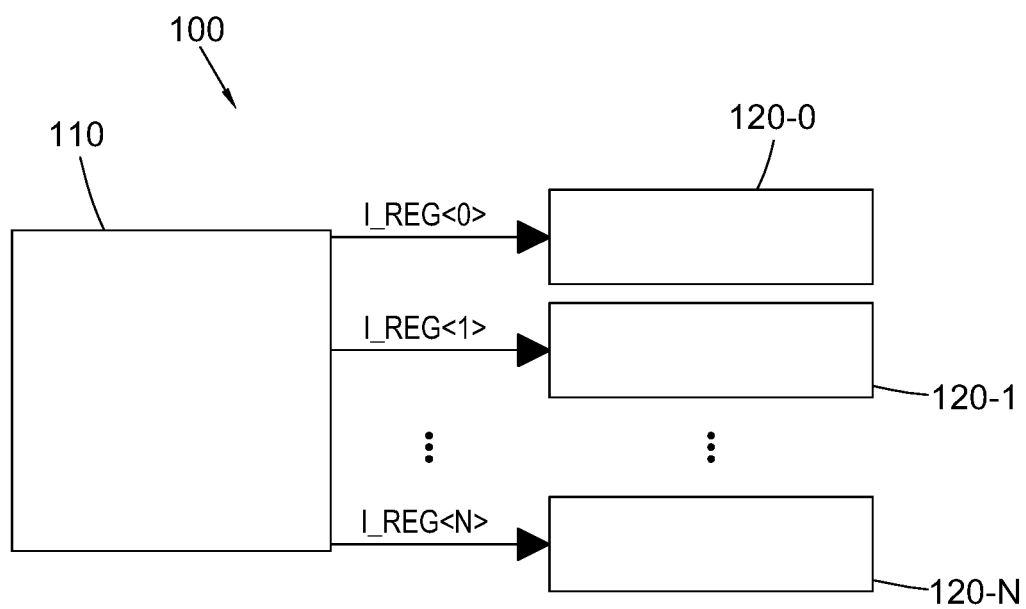
FIG. 1 depicts a global delay-line loop providing a control current to a plurality of time-to-digital converters.

FIG. 1 depicts an arrangement 100 comprising a global delay line loop (DLL) 110 configured to provide a control current to a plurality of time-to-digital converters (TDC) 120-0, 120-1, . . . , 120-N. Such an arrangement 100 may, for example, be implemented in a time-of-flight sensor. A time base is effectively generated by the global DLL 110, wherein the global DLL 110 is configured to generate a regulated current to control a delay line of each TDC 120-0, 120-1, . . . , 120-N. As described in more detail below with reference to FIG. 5, the regulated current may control NMOS devices to define a propagation delay of delay stages forming a delay line.

Figure 2:
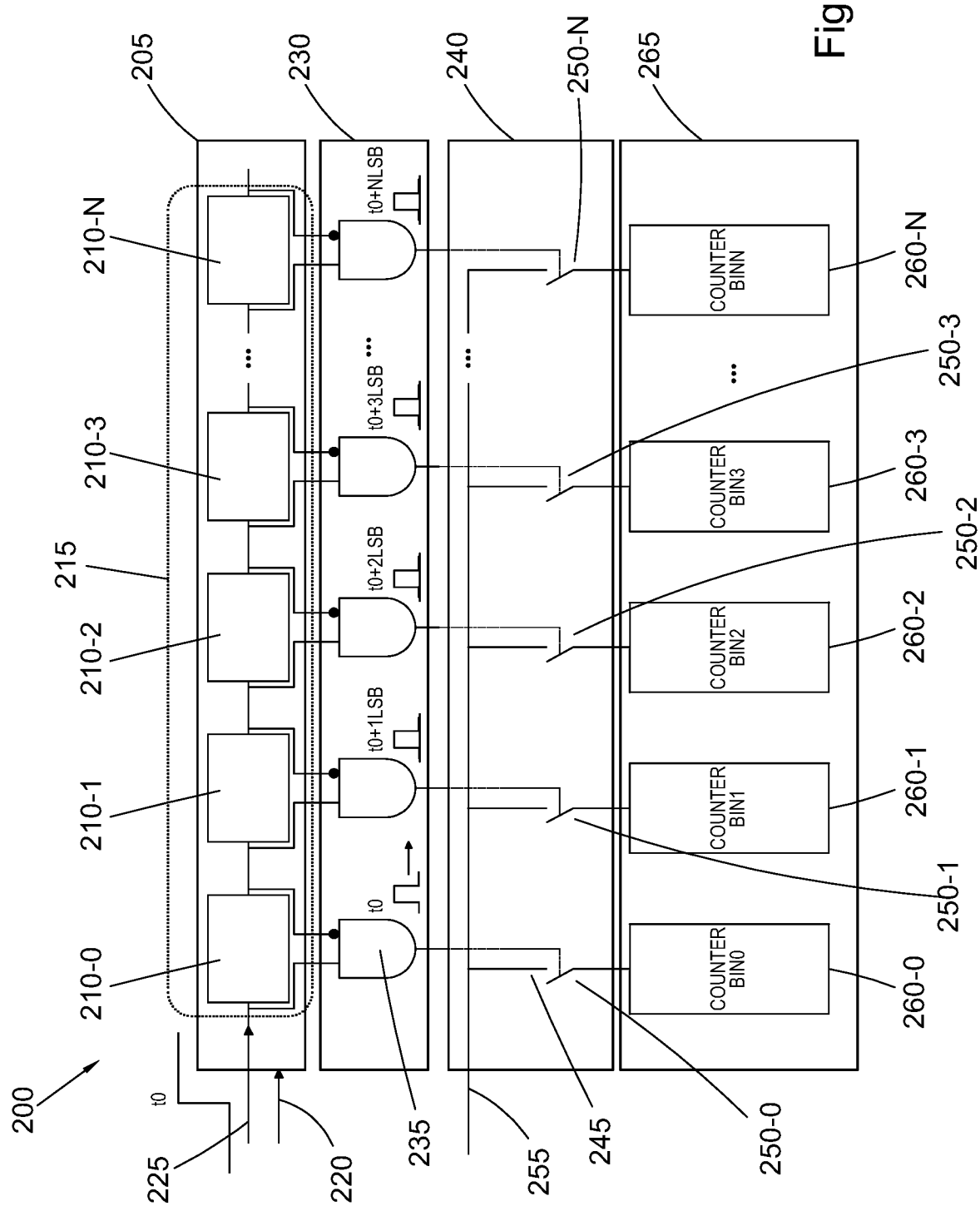
FIG. 2 depicts an implementation of a time-to-digital converter.

FIG. 2 depicts an example implementation of a TDC 200. The TDC 200 may correspond to one of the TDCs 120-0, 120-1, . . . , 120-N depicted in FIG. 1.

The example implementation of the TDC 200 comprises a first sub-block 205. The first sub-block comprises a plurality of delay stages 210-0, 210-1, 210-2, 210-3, . . . , 210-N coupled to form a delay-line 215. A regulated current 220 is provided to the delay line 215, as described with reference to FIGS. 1 and 5. The regulated current 220 defines a timing of the delay-line 215.

A trigger clock signal 225 is provided to trigger the delay-line 215. In use, a measurement window is triggered by a rising edge of the trigger clock signal 225, which defines the start of a measurement period.

The rising edge effectively propagates through the delay line 215. The propagation delay of each element is defined by the regulated current 220 provided by the global DLL 110. The propagation delay is regulated to a certain value, e.g. a defined value, which represents the Least Significant Bit (LSB) of the TDC 200.

An output of the delay line 215 is a thermometer code, e.g. a unary code. That is, an output of the delay line 215 may for example comprise code corresponding to a number of delay stages that the trigger clock signal 225 has propagated through. For example, an output of the delay-line 215 may sequentially be: 0000 . . . 0, 1000 . . . 0, 1100 . . . 0, 1110 . . . 0, . . . , 1111 . . . 0, . . . , 1111 . . . 1.

The example implementation of the TDC 200 comprises a second sub-block 230. The second sub-clock 230 comprises a thermometer to one-hot converter 235. The thermometer to one-hot converter 235 is configured to convert the thermometer code at the output of the delay-line 215 to a one-hot code, wherein only a single bit of the plurality of bits within the one-hot code is asserted. For example, in some embodiments, the thermometer to one-hot converter 235 may convert an input thermometer code of 0000 . . . 0, 1000 . . . 0, 1100 . . . 0, 1110 . . . 0, . . . , 1111 . . . 0, . . . , 1111 . . . 1 to an output one-hot code of 0000 . . . 0, 1000 . . . 0, 0100 . . . 0, 0010 . . . 0, . . . , 0001 . . . 0, . . . , 1111 . . . 1. In some embodiments. In the example of FIG. 2, the thermometer to one-hot converter 235 is formed from a plurality of two-input AND gates, each two-input AND gate having one inverted input.

The example implementation of the TDC 200 comprises a third sub-block 240. The third sub-block 240 comprises a binning circuit 245, e.g. binning logic. The thermometer to one-hot converter 235 of the second sub-block 230 may provide a gating signal to the binning circuit 245 as follows.

The binning circuit 245 consist of a plurality of latches 250-0, 250-1, 250-2, 250-3, . . . , 250-N which are gated by the one-hot code, e.g. the effective gating signal, from the thermometer to one-hot converter 235. For purposes of simplicity, in the example implementation of FIG. 2 each latch 250-0, 250-1, 250-2, 250-3, . . . , 250-N is represented as a switch. Due to the one-hot code from the thermometer to one-hot converter 235, only a single latch 250-0, 250-1, 250-2, 250-3, . . . , 250-N is enabled at a time. That is, the one-hot code may provided to the enable inputs of the plurality of latches 250-0, 250-1, 250-2, 250-3, . . . , 250-N, such that only one latch is effectively transparent at a time.

A second input of each latch of the plurality of latches 250-0, 250-1, 250-2, 250-3, . . . , 250-N, e.g. the D-input, may be connected to one or more signals from a radiation sensor. In an example of a time-of-flight sensor, the second input of each latch of the plurality of latches 250-0, 250-1, 250-2, 250-3, . . . , 250-N may be connected to an array of Single Photon Avalanche Detectors (SPADs). That is, a SPAD event signal 255 may be connected to each latch of the plurality of latches 250-0, 250-1, 250-2, 250-3, . . . , 250-N of the binning circuit 245. As a result, the SPAD event signal 255 will be coupled to only one transparent latch 250-1, 250-2, 250-3, 250-4, . . . , 250-N at a time.

The example implementation of the TDC 200 comprises a fourth sub-block 265. The fourth sub-block 265 comprises a histogram memory. The histogram memory may be implemented as a plurality of event counters 260-0, 260-1, 260-2, 260-3, . . . , 260-N. In the example of FIG. 2 each event counter 260-0, 260-1, 260-2, 260-3, . . . , 260-N, e.g. each bin, is implemented as a ripple counter. Each event counter of the plurality of event counter 260-0, 260-1, 260-2, 260-3, . . . , 260-N is coupled to an output from an associated latch of the plurality of latches 250-0, 250-1, 250-2, 250-3, . . . , 250-N. As described above, the SPAD event signal 255 will be coupled to only one transparent latch 250-0, 250-1, 250-2, 250-3, 250-4, . . . , 250-N at a time, and thus may propagate to an associated event counter of the plurality of event counters 260-0, 260-1, 260-2, 260-3, . . . , 260-N. As such, in use the binning circuit sorts the SPAD events into the correct event counter 260-0, 260-1, 260-2, 260-3, . . . , 260-N.

Figure 3:
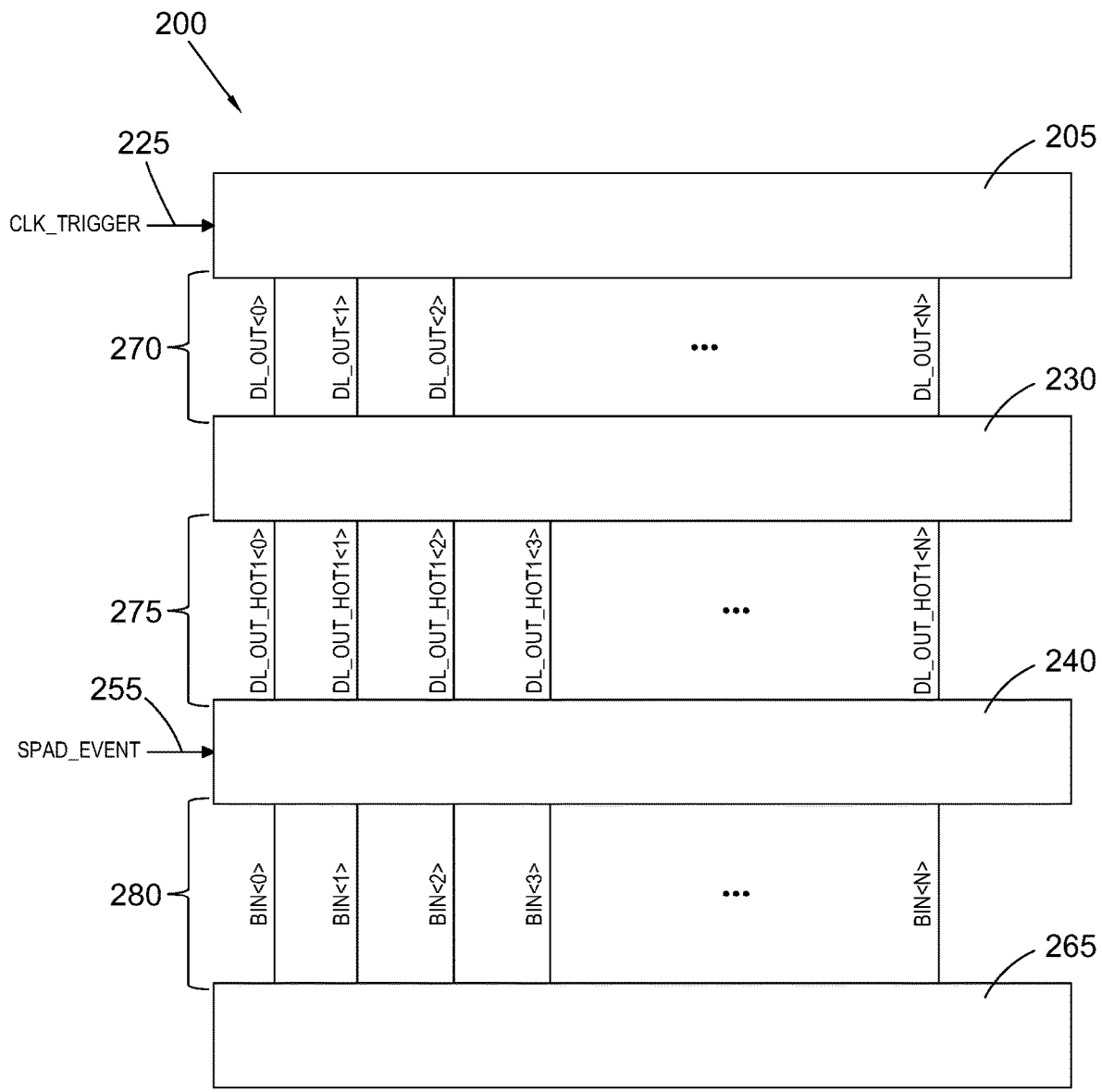
FIG. 3 depicts a high-level schematic of the time-to-digital converter.

For completeness, FIG. 3 depicts the TDC 200 of FIG. 2 comprising: first sub-block 205 which comprises the delay line 215; second sub-block 230 which comprises the thermometer to one-hot converter 235; third sub-block 240 which comprises the binning circuit 245; and fourth sub-block 265 which comprises histogram memory implemented as a plurality of event counters 260-0, 260-1, 260-2, 260-3, . . . , 260-N. FIG. 2 depicts signals between each sub block 205, 230, 240, 250. For example, a plurality of outputs 270 from the delay line are denoted "DL_OUT<N>". In an example implementation, the delay line may comprise 32 delay stages, and thus the outputs 270 may range from "DL_OUT<0>" to "DL_OUT<31>". The outputs 270 from the first sub-block 205 provide a thermometer code as inputs to the second sub-block 230.

In the example implementation of FIG. 3, the outputs 275 from the second sub-block 230 are provided as inputs to the third sub-block 240 as a one-hot code, e.g. with only a single output of the plurality of outputs 275 asserted. The outputs 375 from the second sub-block 230 are denoted "DL_OUT_HOT1<N>".

A plurality of signals 280 denoted "BIN<0>" to "BIN<N>" are provided from the third sub-block 240 to the fourth sub-block 265. As described above, the SPAD event signal 255 will be coupled to one event counter at a time by the binning circuit 245 of the third sub-block 240.

Figure 4:
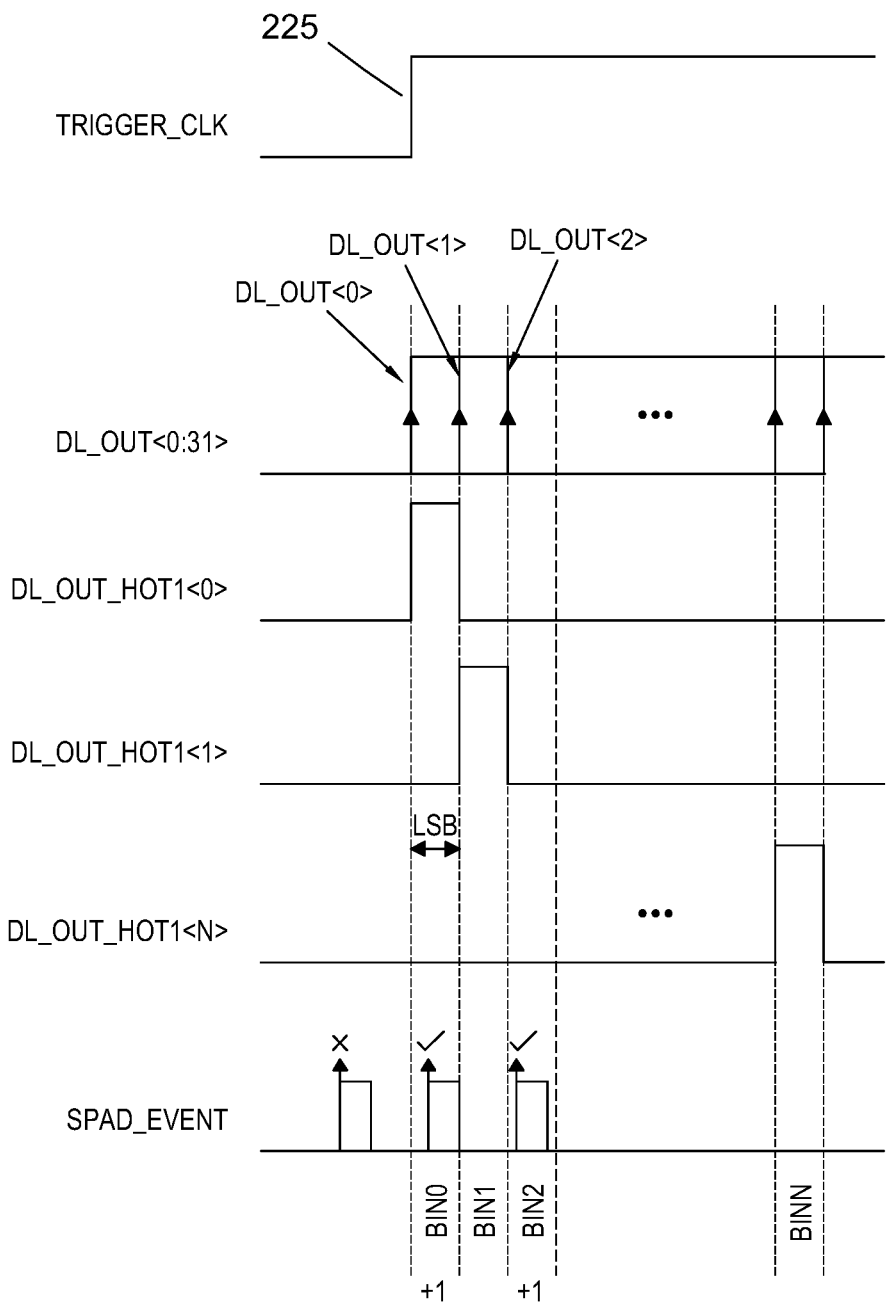
FIG. 4 depicts a timing diagram showing a measurement cycle of the time-to-digital converter.

FIG. 4 is a timing diagram depicting a measurement cycle of the time-to-digital converter 200.

The rising edge of the trigger clock signal 225, denoted "TRIGGER_CLK" propagates through the delay line 215, thus incrementing the thermometer code at the output every time the rising edge of the trigger clock signal 225 passes a delay stage 210-0, 210-1, 210-2, 210-3, . . . , 210-N. As such, the thermometer to one-hot converter 235 generates a propagating "1" which defines a gating window to the corresponding event counter at the binning circuit 245. That is, DL_OUT_HOT1<0> is asserted, then DL_OUT_HOT1<1> is asserted and DL_OUT_HOT1<0> is negated, and so on for all of DL_OUT_HOT1<0> to DL_OUT_HOT1<N>.

This propagating "1" enables a switch, e.g. a latch 250-0, 250-1, 250-2, 250-3, . . . , 250-N, thereby coupling the SPAD event signal 255, denoted "SPAD_EVENT", to the histogram memory of the fourth sub-block 265. The SPAD event signal 255 is coupled to a SPAD array.

Figure 5:
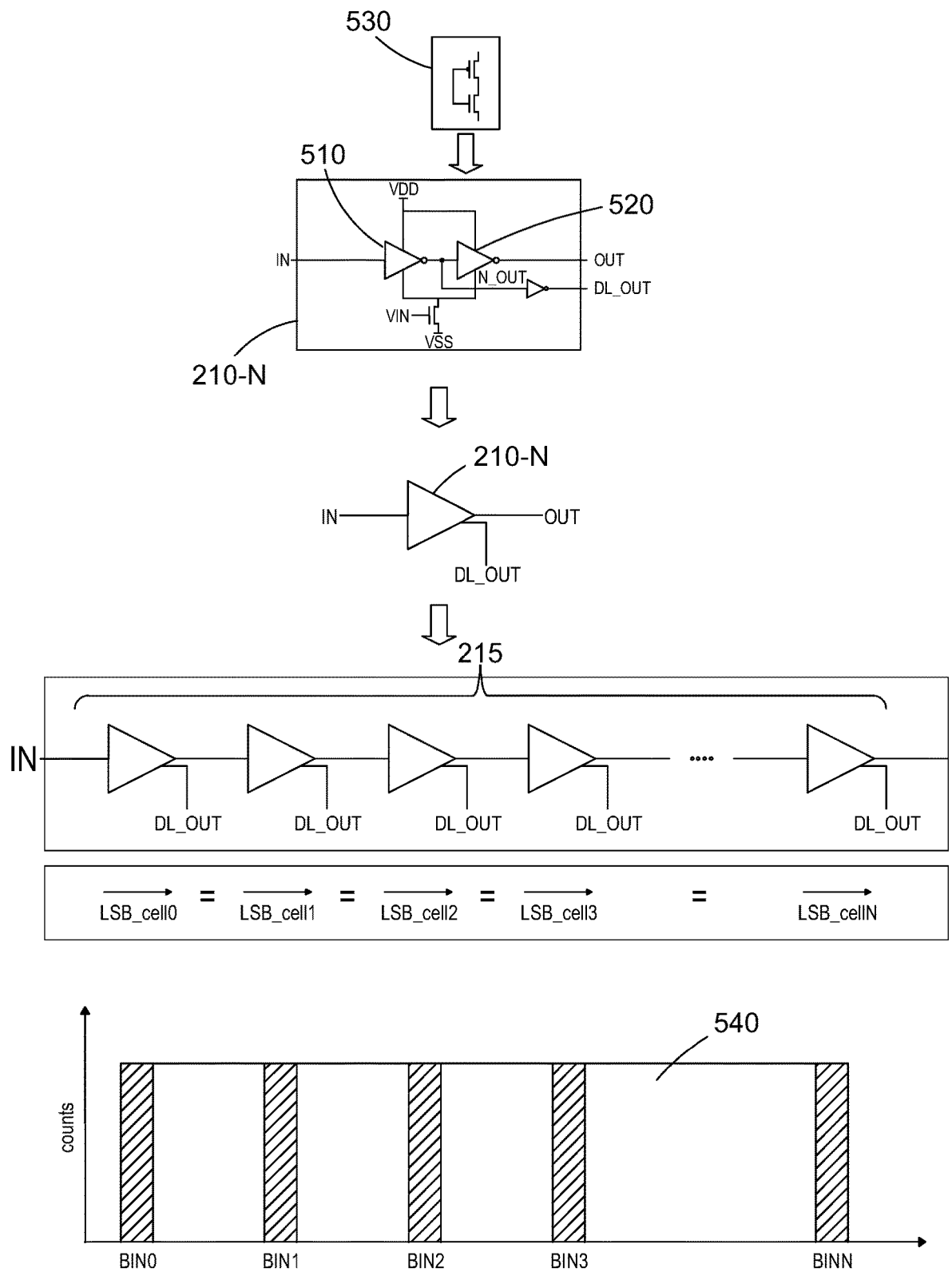
FIG. 5 depicts implementation details of an ideal delay line.

For purposes of example, FIG. 5 depicts implementation details of an ideal delay line.

As described above, the TDC 200 implements a delay line 215 to define an LSB of the TDC 200. Each delay stage 210-0, 210-1, 210-2, 210-3, . . . , 210-N of the delay-line 200 comprises two inverters 510, 520 each using a current starved NMOS device 530 to control the propagation delay of the delay line 215, e.g. the LSB of the TDC. A plurality of delay stages 210-0, 210-1, 210-2, 210-3, . . . , 210-N are coupled in series to build the delay line 215 of the TDC 200.

In ideal conditions, e.g., for a TDC 200 unaffected by device mismatch or layout depended effects, each delay stage 210-0, 210-1, 210-2, 210-3, . . . , 210-N will have exactly the same propagation delay. As such, using control signals, e.g. outputs 270 from the delay line denoted "DL_OUT<N>", to control the binning circuit 245 will apply uniformly distributed events over a measurement period. That is, the propagation delay (LSB) associated with each delay stage 210-0, 210-1, 210-2, 210-3, . . . , 210-N will be equal and therefore a code density test of the TDC would lead to uniformly distributed counts of histogram data 540. That is, all event counters of the histogram memory would be filled up to the same count level and no DNL would be detected.

In practice, the delay line 215 is non-ideal due at least in part to device mismatch and/or layout dependent effects. Generally, the smaller the devices the larger the error due to mismatch. Furthermore, due to a substantial number of TDCs required for large pixel arrays, potentially in the region of hundreds or even thousands, small devices are mandatory to ensure cost-effectiveness and low power.

Figure 6:
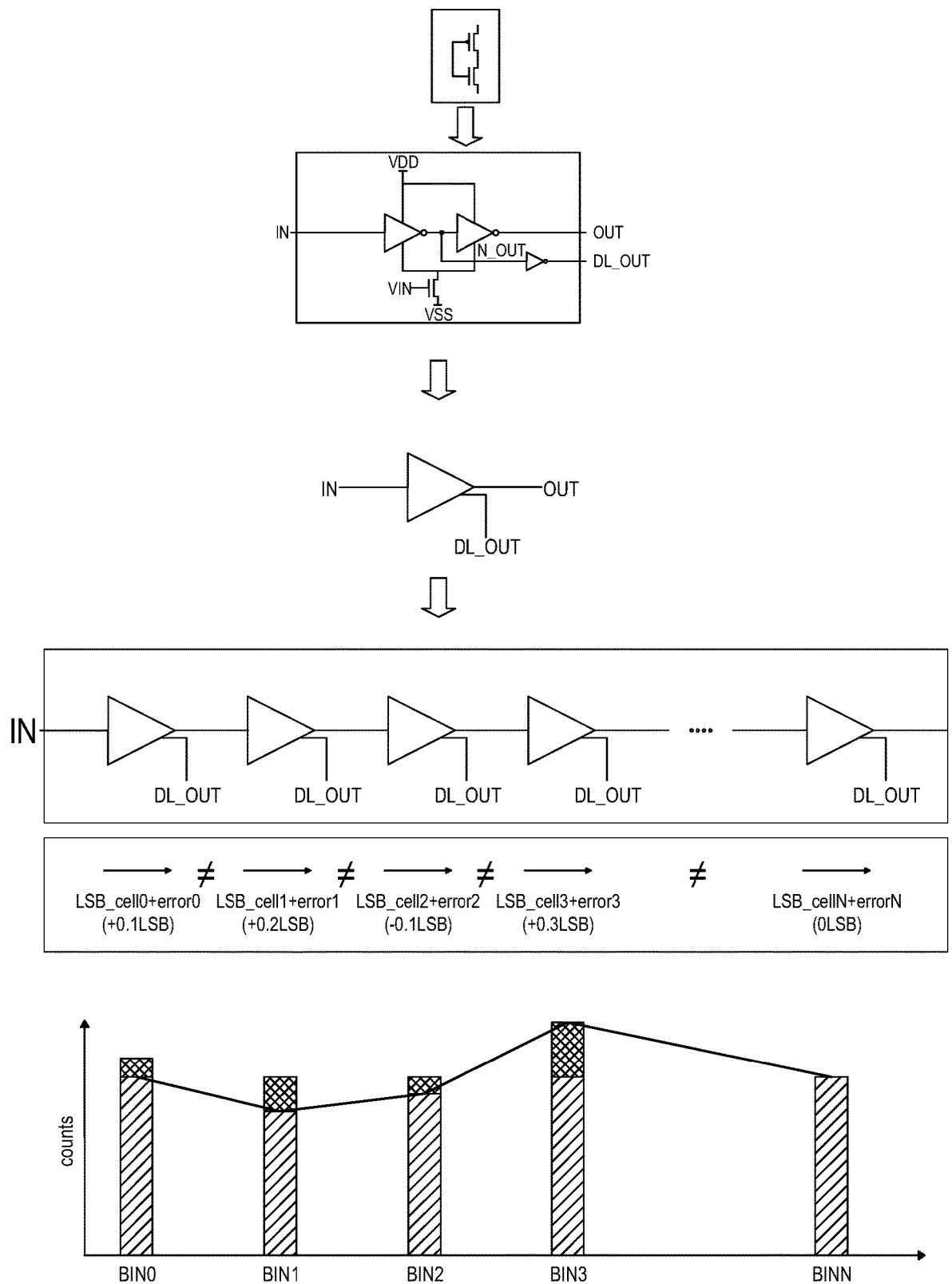
FIG. 6 depicts implementation details of a non-ideal delay line.

If the control signal of a non-ideal delay line is used to control the binning circuit, the LSB error of the delay line will be projected to a bin count error, e.g. an event counter error, in the histogram memory. This is depicted in FIG. 6, which shows a case of a non-ideal delay line, e.g. a delay line with some degree of device mismatch and/or layout dependent effects, wherein the propagation delay (LSB) of each delay stage may be different. As such, a code density test of the TDC would lead to a non-uniform distribution of counts of histogram data 640.

Figure 7:
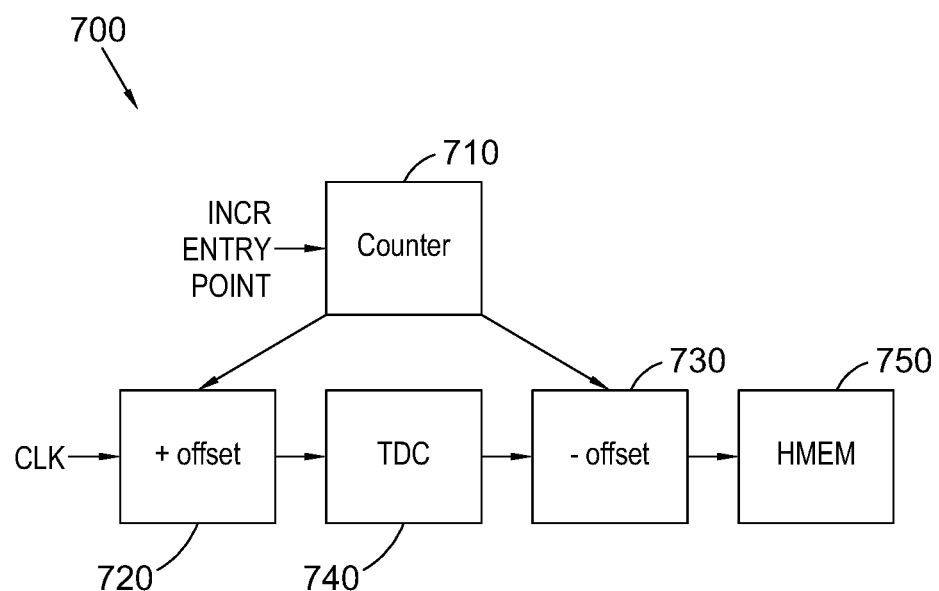
FIG. 7 depicts an overview of a time-to-digital converter according to an embodiment of the invention.

FIG. 7 depicts an overview of a TDC circuit 700 according to an embodiment of the invention. Similar to the TDC 200 of FIG. 2, the TDC circuit 700 is a delay stage based TDC circuit 700 and the time-base (LSB) is defined by NMOS current starved delay elements due to a regulated current that is provided by a global DLL. However, in contrast to the implementation of FIG. 2, a counter 710 and first offset circuitry 720 is configurable to provide means to incrementally inject a clock signal into each stage of the delay line, e.g. to delay line stage 0, then stage 1, then stage 2, etc., of the TDC 740. That is, an entry point into the delay line of a trigger signal may be incremented by application of a first offset generated by the counter 710 and first offset circuitry 720. Furthermore, additional second offset circuitry 730 may be added to compensate for the effects of the first offset and to ensure SPAD events are routed to the correct event counter of the histogram memory 750, as described in more detail with reference to FIG. 8. The first offset circuitry may apply a positive first offset and the second offset circuitry may apply a negative second offset, or vice versa.

Figure 8:
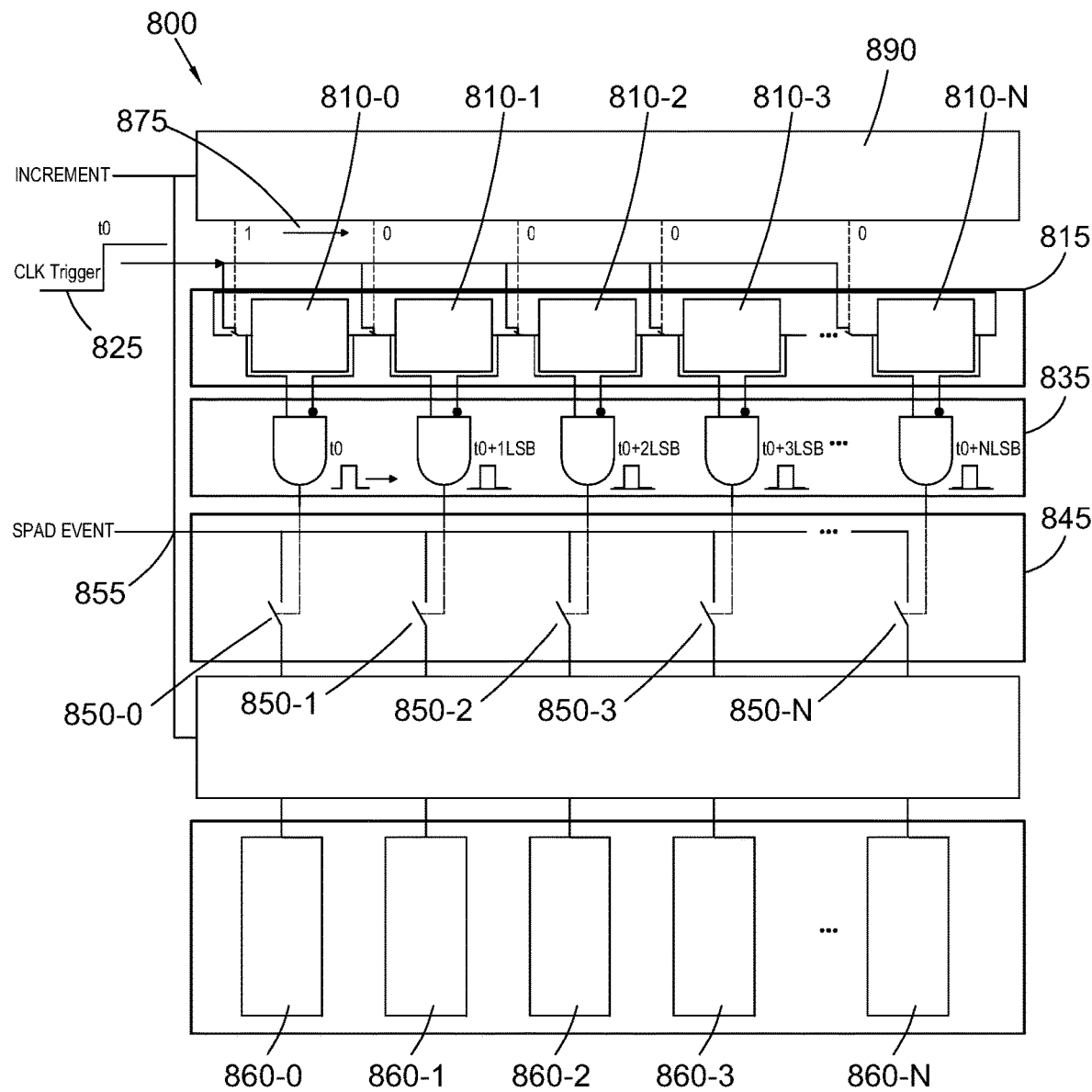
FIG. 8 depicts a time-to-digital converter according to an embodiment of the invention.

FIG. 8 depicts a TDC circuit 800 according to an embodiment of the invention. The TDC circuit 800 comprises a plurality of delay stages 810-0, 810-1, 810-2, 810-3, . . . , 810-N coupled to form a delay-line 815. A regulated current is provided to the delay line 815, as described with reference to the example implementation of FIG. 2, wherein the regulated current defines a timing of the delay-line 815.

A trigger clock signal 825 is provided to trigger the delay-line 815. In use, a measurement window is triggered by a rising edge of the trigger clock signal 825, which defines the start of a measurement period.

The rising edge effectively propagates through the delay line 815. The propagation delay of each element is defined by the regulated current provided by a global DLL, e.g. global DLL 110. The propagation delay is regulated to a certain value, e.g. a defined value, which represents the Least Significant Bit (LSB) of the TDC circuit 800.

In contrast to the TDC 200 of FIG. 2, the TDC circuit 800 comprises an encoder circuit 890 configured to sequentially trigger a different delay stage of the plurality of delay stages 810-0, 810-1, 810-2, 810-3, . . . , 810-N. The encoder circuit 890 is used to generate a control signal defining an entry point of the delay line 815. The encoder circuit 890 is configured to generate a count that defines an offset relative to the first delay stage 810-0 of the delay line 815. The offset is used to define the entry point of the delay line 815. The count is also provided to a decoder circuit 895 for compensating for the offset. As such, the encoder circuit 890 may be configured to sequentially trigger a different delay stage of the plurality of delay stages 810-0, 810-1, 810-2, 810-3, . . . , 810-N, as described in more detail below.

An output of the delay line 815 is a thermometer code, e.g. a unary code. That is, an output of the delay line 815 may for example comprise code corresponding to a number of delay stages that the trigger clock signal 825 has propagated through.

The TDC circuit 800 comprises a thermometer to one-hot converter 835. The thermometer to one-hot converter 835 is configured to convert the thermometer code at the output of the delay-line 815 to a one-hot code, wherein only a single bit of the plurality of bits within the one-hot code is asserted. In the example embodiment of FIG. 8, the thermometer to one-hot converter 835 is formed from a plurality of two-input AND gates, each two-input AND gate having one inverted input. As such, a signal from the delay line, e.g. the thermometer code which is subsequently converted to a one-hot code, may be used by a binning circuit 425 to select an event counter, as described below.

The example embodiment of the TDC circuit 800 comprises the binning circuit 845. The thermometer to one-hot converter 835 may effectively provide a gating signal to the binning circuit 845 as follows.

The binning circuit 845 consist of a plurality of latches 850-0, 850-1, 850-2, 850-3, . . . , 850-N which are gated by the one-hot code, e.g. the effective gating signal, from the thermometer to one-hot converter 835. For purposes of simplicity, in the embodiment of FIG. 8 each latch 850-0, 850-1, 850-2, 850-3, . . . , 850-N is represented as a switch. Due to the one-hot code from the thermometer to one-hot converter 835, only a single latch 850-0, 850-1, 850-2, 850-3, . . . , 850-N is enabled at a time. That is, the one-hot code may be provided to the enable inputs of the plurality of latches 850-0, 850-1, 850-2, 850-3, . . . , 850-N, such that only one latch is effectively transparent at a time.

A second input of each latch of the plurality of latches 850-0, 850-1, 850-2, 850-3, . . . , 850-N, e.g. the D-input, may be connected to a SPAD array. That is, a SPAD event signal 855 may be connected to each latch of the plurality of latches 850-0, 850-1, 850-2, 850-3, . . . , 850-N of the binning circuit 845. As a result, the SPAD event signal 855 will be coupled to only one transparent latch 850-1, 850-2, 850-3, 850-4, . . . , 850-N at a time. The binning circuit 845 also comprises the decoder circuit 895. The decoder circuit is configured to apply an offset to compensate for the offset used to define the entry point of the delay line 815, as described in more detail with reference to FIGS. 9 and 10.

The TDC circuit 800 also comprises a histogram memory. The histogram memory may be implemented as a plurality of event counters 860-0, 860-1, 860-2, 860-3, . . . , 860-N. In the embodiment of FIG. 8, each event counter is implemented as a ripple counter. Each event counter of the plurality of event counters 860-0, 860-1, 860-2, 860-3, . . . , 860-N is coupled to an output from the decoder circuit 895. As described above, the SPAD event signal 855 will be coupled to only one transparent latch 850-0, 850-1, 850-2, 850-3, 850-4, . . . , 850-N at a time, and thus may propagate through the decoder circuit 895, where an offset may be applied to route the SPAD event signal 855 to an associated event counter of the plurality of event counters 860-0, 860-1, 860-2, 860-3, . . . , 860-N. As such, in use the binning logic sorts the SPAD events into the correct event counter 860-0, 860-1, 860-2, 860-3, . . . , 860-N, taking into account the entry point to the delay line 815.

Figure 9:
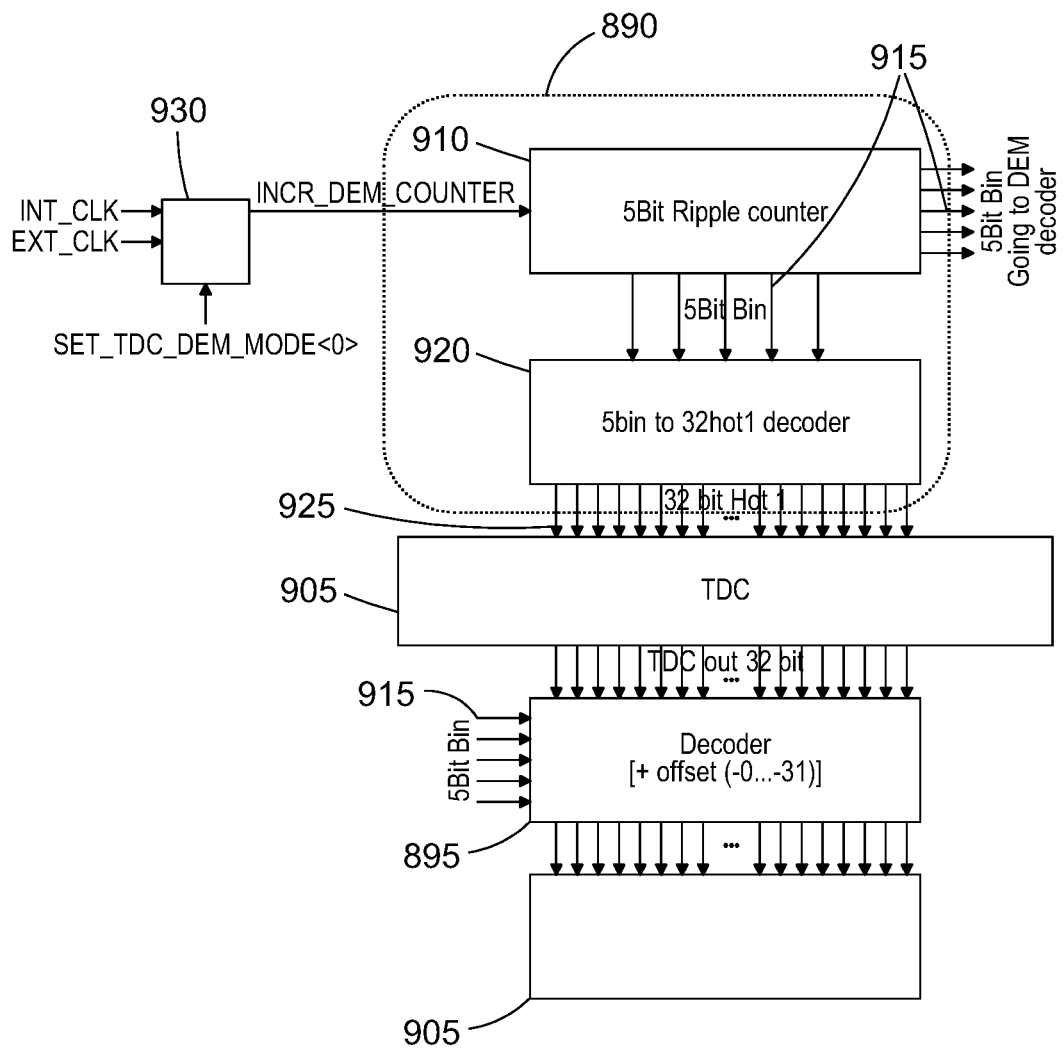
FIG. 9 depicts a schematic of the encoder and decoder of a time-to-digital converter according to an embodiment of the invention.

FIG. 9 depicts the TDC circuit 800 of FIG. 8, with more detail in particular of encoder circuit 890 and the decoder circuit 895, according to an embodiment of the invention. For simplicity, in FIG. 9 the delay line 815, the thermometer to one-hot converter 835 and the plurality of latches 850-0, 850-1, 850-2, 850-3, . . . , 850-N, are represented as a single block, denoted TDC 905.

The encoder circuit 890 comprises a counter 910. In some embodiments, the counter 910 may be a ripple counter. In the example embodiment of FIG. 9, the counter 910 is a 5-bit counter, providing a 5-bit binary output 915. It will be appreciated that in other embodiments, the counter may have greater than or fewer than 5 bits and thus may provide an output 915 comprising greater than or fewer than 5 bits.

A value of the output 915 is used to define an offset counted from the first delay stage of the TDC circuit 900, e.g. an offset from delay stage 810-0 of FIG. 8. The output 915 is connected to a binary to one-hot converter 920. An output 925 from the binary to one-hot convert provides a trigger to the delay line of the TDC circuit 900, e.g. the block denoted TDC 905. Continuing with the example embodiment of a 5-bit counter 910, the output 925 from the binary to one-hot converter 920 is a 32-bit output, wherein only a single bit of the 32-bit output 925 is asserted depending upon the current count of the 5-bit counter 910. Referring back to FIG. 8, this is depicted as the sequence "1, 0, 0, 0, . . . , 0", wherein the arrow 875 signifies that the "1" propagates, such that a subsequent outputs would be "0, 1, 0, 0, . . . , 0" then "0, 0, 1, 0, . . . , 0", and so on. As such, the encoder circuit 890 operates in a similar manner to a shift register. The 32-bit output 920 defines the stage of the delay line that will function as the first stage, e.g. the entry point of the delay line. An implementation of a delay stage, e.g. delay stage 810-N of FIG. 8, is described in more detail below with reference to FIG. 11.

Also shown in the example embodiment of FIG. 9 is a multiplexer 930, which is used to define a source for incrementing the counter 910. For example, an internal clock source or an external clock source, denoted INT_CLK and EXT_CLK respectively, may be provided to increment the counter 910.

The output 915 from the counter 910 is also provided as an input to the decoder circuit 895. The decoder circuit 895 may effectively operate as a multiplexer, shifting input signals received from the latches in the binning circuit, e.g. latches 850-0, 850-1, 850-2, 850-3, 850-4, . . . , 850-N as shown in FIG. 8, in dependency of the output 915 from the counter 910. Continuing with the example embodiment of FIG. 9 with a 5-bit counter 910, the decoder circuit 895 may shift all input signals from the latches in the binning circuit by between 0 and 31 in dependency of the output 915 from the counter 910. For example:
- if the value of the output 915 from the counter 905 is 0b00000, then an input <n> of the decoder circuit 895 may correspond to an output <n> of the decoder circuit 955;
- if the value of the output 915 from the counter 905 is 0b00001, then an input <n> of the decoder circuit 985 may correspond to an output <n−1> of the decoder circuit 955;
- if the value of the output 915 from the counter 905 is 0b11111, then an input <n> of the decoder circuit 895 may correspond to an output <n−31> of the decoder circuit 955.

An output 940 from the decoder block 895 is connected to a histogram memory 950, e.g. the plurality of event counters 860-0, 860-1, 860-2, 860-3, . . . , 860-N.

Figure 10:
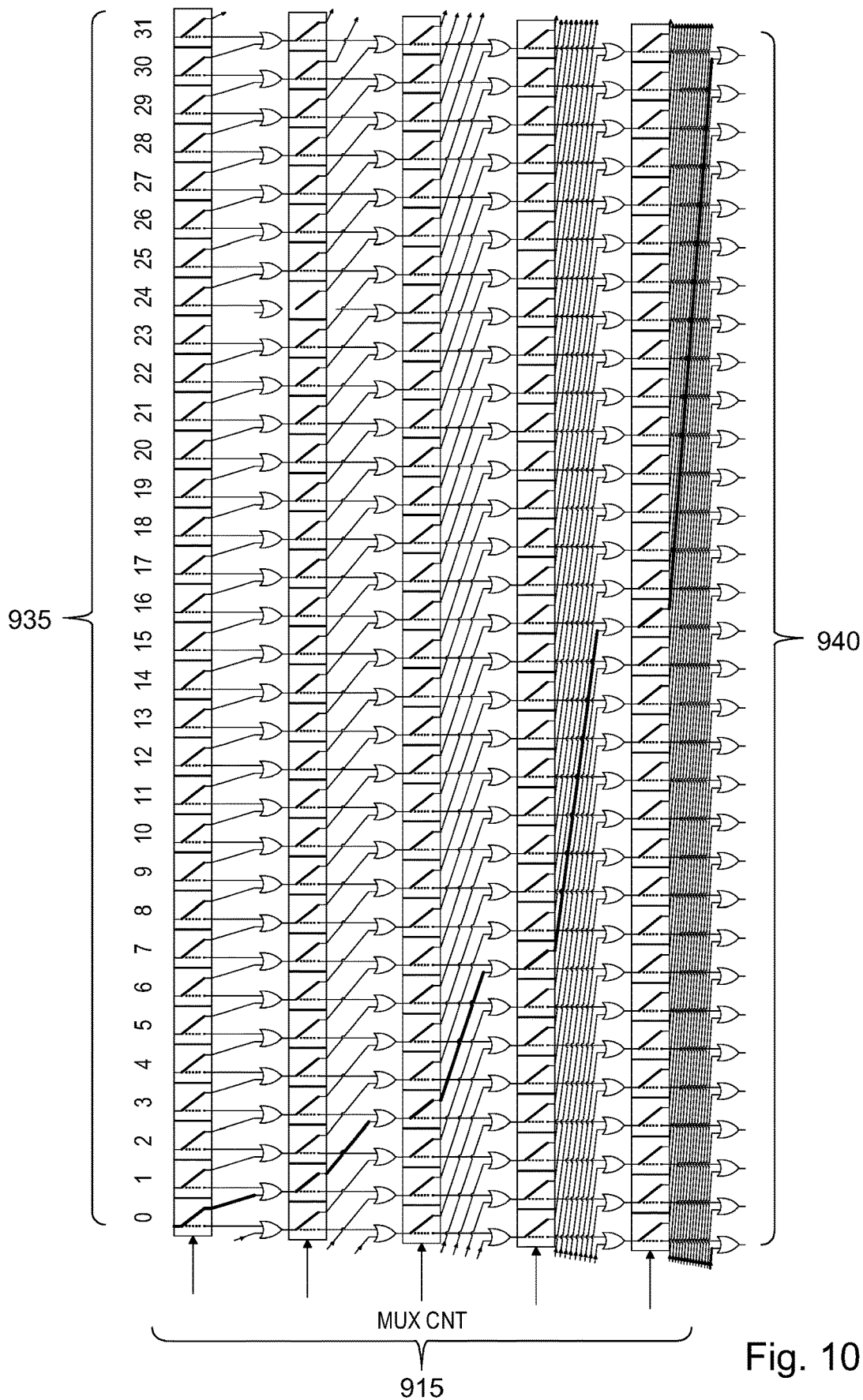
FIG. 10 depicts a schematic diagram of decoder logic.

FIG. 10 shows an example implementation of the decoder circuit 895. The 5-bit binary output 915 from the incrementing counter 910 provides control of the decoder circuit 895, selecting which of inputs 935 is connected to which of outputs 940. As such, the decoder circuit 895 operates as a 1 to N multiplexer which is configured to connect an input to any one of all possible outputs.

It will be appreciated that the example embodiment of FIG. 9 uses a 32-bit encoder 890, a 32-bit decoder 895 and a 5-bit counter 905 for purposes of example only, and other dimensions, e.g. with few or more bits, may be implemented.

As described above, the delay line 815 consists of N delay stages 810-0, 810-1, 810-2, 810-3, . . . , 810-N, each stage having a propagation delay controlled by a control current provided by the global DLL, e.g. global DLL 110. In an embodiment of the invention, a feedback from the last delay stage 810-N to the first delay stage 810-0 may be used to form a loop, in a similar manner to a ring oscillator. The delay line 815 comprises an even number of stages.

Figure 11:
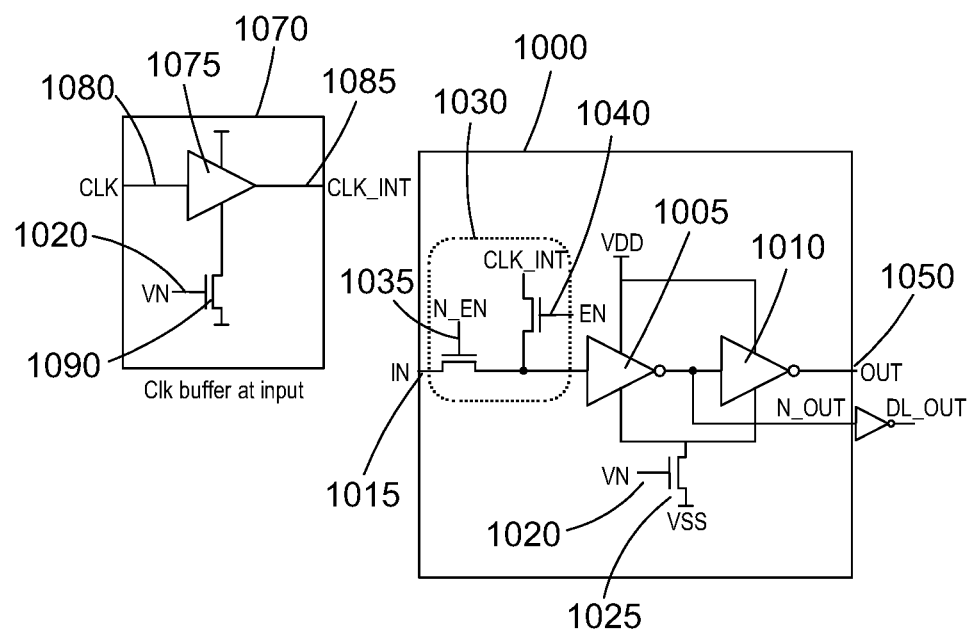
FIG. 11 depicts a delay line stage and clock buffer logic, according to an embodiment of the invention.

FIG. 11 depicts a delay line stage 1000 and clock buffer logic 1070, according to an embodiment of the invention. The delay line stage 1000 may correspond to any of the delay stages 810-0, 810-1, 810-2, 810-3, . . . , 810-N of FIGS. 8 and 9.

The delay line stage 1000 comprises a first inverter 1005 and a second inverter 1010, coupled to provide a delay. An input 1015 to the delay line stage 1000 is coupled to a previous delay line stage. An output 1020 from the delay line stage 1000 is coupled to a next delay line stage.

A bias voltage 1020 is provided to a gate of a transistor 1025 coupled to a power supply of the first inverter 1005 and a second inverter 1010. As such, the bias voltage 1020 may control a propagation delay of the first inverter 1005 and the second inverter 1010. In some embodiments, the bias voltage 1020, or a current used to derive the bias voltage 1020, may be provided by a global DLL such as global DLL 110.

In some embodiments the delay line stage 1000 is coupled to clock buffer logic 1070. The clock buffer logic 1070 may comprise a buffer 1075 configured to buffer an input clock signal 1080 to provide a buffered output clock signal 1085. In some embodiments, the bias voltage 1020 may be provided to a gate of a transistor 1090 coupled to a power supply of the buffer 1075. As such, the bias voltage 1020 may also control a propagation delay of the buffer 1075. Furthermore, The delay line stage 1000 also comprises a multiplexer circuit 1030. A first multiplexer control input 1035 is coupled to a gate of a transistor 1045, wherein the first multiplexer control input 1035 may configure the transistor to couple an input of the first inverter 1005 to an output from a previous stage of the delay line.

A second multiplexer control input 1040, which is the inverse of the first multiplexer control input 1035, is coupled to a gate of a transistor 1055, wherein the second multiplexer control input 1040 may configure the transistor 1055 to couple the input of the first inverter 1005 to an input clock signal 1060. In some embodiments, the input clock signal 1060 is the buffered output clock signal 1085.

As such, the first multiplexer control input 1035 and the second multiplexer control input 1040 may select whether the delay line stage 1000 operates as an entry point for the clock signal, e.g. input clock signal 1060 is an output from the clock buffer logic 1050, or whether the delay line stage 1000 operates as a delay line stage, wherein an input 1015 from a previous delay line stage propagates through the delay line stage with a delay defined predominantly by the first inverter 1005 and a second inverter 1010.

That is, in some embodiments:

If multiplexer control input 1035 "N_EN"=0 the stage 1000 operates as entry point element. An input from the previous delay line stage is disconnected and the clk input 1015 input connected to the stage 1000. A rising edge at the clk input injects a propagating signal to the delay line stage 1000, eventually causing all elements to go 1. A falling edge of clk resets the delay line causing all elements go to 0.

If multiplexer control input 1035 "N_EN"=1 the delay line stage 1000 operates as delay stage. The input from the previous stage is delayed and transferred to the output.

A further inverter 1095 is coupled to an output from the first inverter 1005. An output from the further inverter 1095 is an output from the delay line stage 1000 to the thermometer to one-hot converter of the TDC, e.g. outputs 270 from the delay line as denoted "DL_OUT<N>" in FIG. 3.

Figure 12:
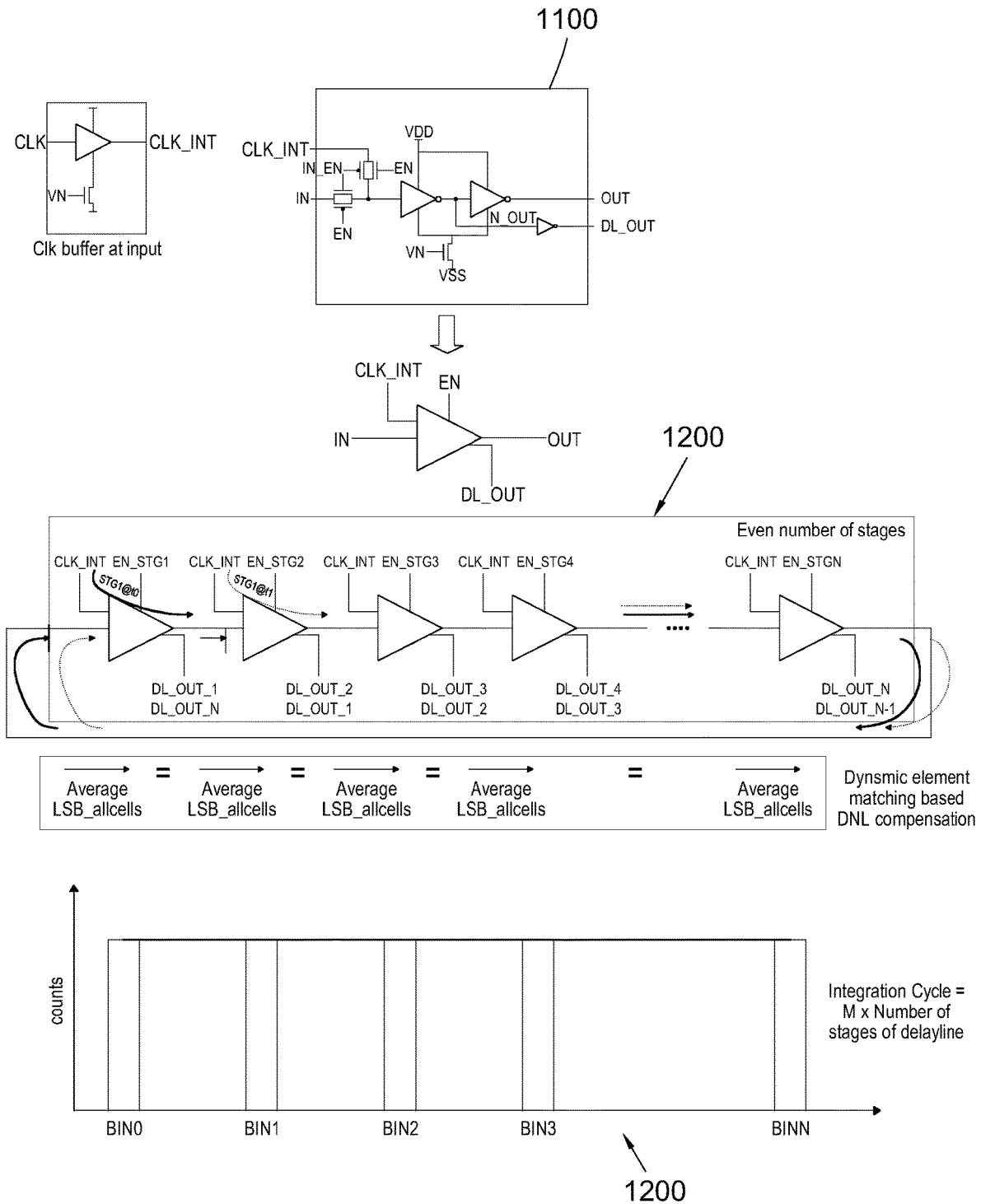
FIG. 12 depicts implementation details of a delay line implementation, according to an embodiment of the invention.

FIG. 12 depicts implementation details of a delay line according to an embodiment of the invention. Each element of the delay line 1200 comprises a delay line stage 1000 as described above with reference to FIG. 11. That is, each delay stage of the delay line 1200 has additional inputs for to program the delay stage to be an entry stage or a follower stage.

In some embodiments, the entry stage is sequentially incremented. As such, in an initial cycle, Cycle 1, the sequence of delay stages may be stage 1 to 31. In a subsequent cycle, Cycle 2, the sequence of delay stages may be stage 2 to 1. In a subsequent cycle, Cycle 3, the sequence of delay stages may be stage 3 to 2, and so on. As such, each delay stage acts at least once as stage 1, 2, 3, . . . . As a result, the LSB error of each stage will average out. Mitigating the effects of device mismatch and layout depended LSB errors.

Thus, in the case of non-ideal components where the propagation delay (LSB) of each delay stage may be different, due to a linear increment of the entry stage as described above, the LSB error is minimized. In some embodiments, an Integration cycle needs to be M×Number of stages, where M is an integer.

As such, a code density test of the TDC according to an embodiment of the invention would lead to a uniform distribution of counts in the histogram 1220.

Figure 13:
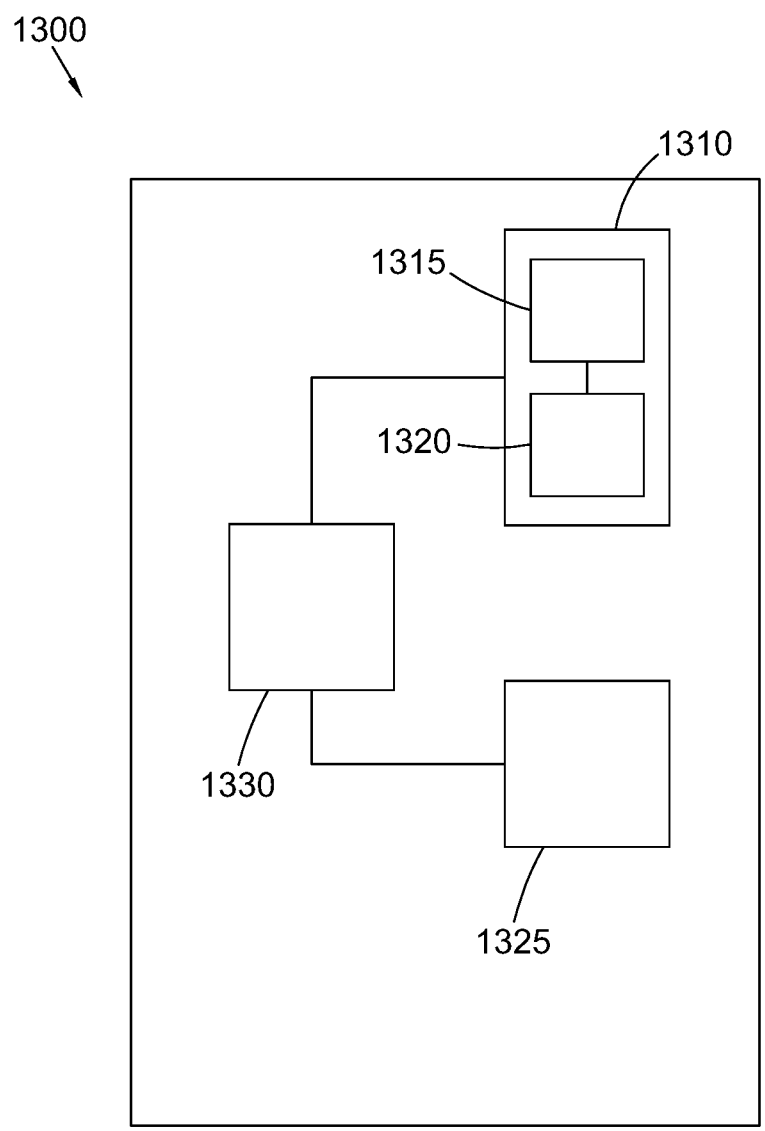
FIG. 13 depicts an example apparatus according to an embodiment of the invention.

FIG. 13 depicts an apparatus 1300 according to an embodiment of the invention. The apparatus 1300 is, for purposes of example only, a smartphone. It will be appreciated that the time to digital converter circuit described herein is also applicable to other apparatuses, such as a cellular telephone, a tablet, a laptop or portable device, or the like.

The apparatus comprises a time-of flight sensor 1310. The time of flight sensor comprises an array of single photon avalanche diodes (SPADs) 1315 and a plurality of time-to-digital converter circuits 1320. The time-to-digital converter circuits 1320 may be time-to-digital converter circuits 700, 800, 900 as described above with reference to FIGS. 7, 8 and 9. The array of SPADs 1315 is coupled to the plurality of TDC circuits 1320. Each TDC circuits of the plurality of TDC circuits 1320 is configured to associate SPAD-events with an event counter from a plurality of event counters.

The example apparatus 1300 also comprises a camera 1325, and processing circuitry 1330 coupled to the time-of-flight-sensor 1310 and the camera 1325. In some embodiments, the processing circuitry 1330 is configured to adjust a focus of the camera 1325 and/or adapt an image taken by the camera 1325 in response to a distance to a target determined by the time-of-flight-sensor 1310.

Figure 14:
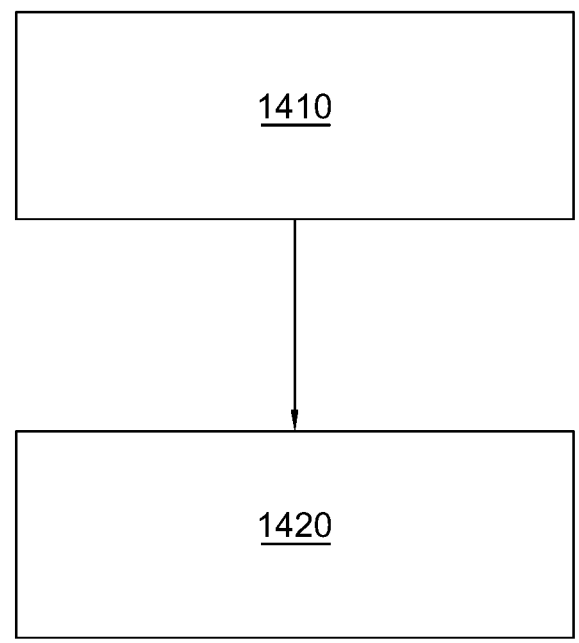
FIG. 14 depicts a method of reducing an error in a time-to-digital converter circuit, according to an embodiment of the invention.

FIG. 14 depicts a method of reducing an error in a time-to-digital converter circuit comprising a delay line, a binning circuit and a plurality of event counters. The method comprises a step 1410 of configuring a trigger for a delay line to sequentially trigger a different delay stage of the delay line. The method also comprises a step 1420 of configuring the binning circuit to select an event counter from a plurality of event counters based on a signal from the delay line. It will be appreciated that, in embodiments, either step may be performed first, or both steps may be performed concurrently.

Although the disclosure has been described in terms of particular embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in any embodiments, whether alone or in any appropriate combination with any other feature disclosed or illustrated herein.

The invention claimed is:

1. A time-to-digital converter circuit comprising:
a plurality of delay stages connected to form a delay line;
a plurality of event counters;
an encoder circuit for triggering the delay line; and
a binning circuit for enabling a single photon avalanche diode (SPAD) event signal to propagate to an event counter from plurality of event counters,
wherein the encoder circuit is configured to sequentially trigger a different delay stage of the plurality of delay stages, and wherein the binning circuit selects the event counter based on a signal from the delay line, and
wherein the binning circuit comprises a decoder circuit for generating a second offset for offsetting a selection of an event counter.

2. The time-to-digital converter circuit of claim 1, wherein the encoder circuit is configured to generate a first offset relative to a first stage of the delay line, the first offset corresponding to an entry point for a trigger to the delay line.

3. The time-to-digital converter circuit of claim 2, wherein the encoder circuit comprises a one-hot converter configured to convert an output from a counter to data corresponding to the first offset.

4. The time-to-digital converter circuit of claim 1, wherein the encoder circuit is configured to provide data to the decoder circuit, such that the second offset is for compensating for the first offset.

5. The time-to-digital converter circuit of claim 1, wherein the decoder circuit comprises multiplexer circuitry configured to associate detected events with any of the plurality of event counters.

6. The time-to-digital converter circuit of claim 1, wherein the binning circuit comprises a thermometer to one-hot converter configured to convert the signal from the delay line to a signal for selecting a single event counter.

7. The time-to-digital converter circuit of claim 1, wherein the plurality of event counters are configured to correspond to a histogram memory, and wherein each event counter comprises a ripple counter.

8. The time-to-digital converter circuit of claim 1, wherein each delay stage comprises a delay element configured to receive a regulated current, wherein a timing of the delay element depends upon the regulated current.

9. A time-of-flight sensor comprising:
an array of single photon avalanche diodes (SPADs); and
at least one time-to-digital converter circuit according to claim 1;
wherein the array of SPADs is coupled to the at least one time-to-digital converter circuit, and the at least one time-to-digital converter circuit is configured to associate SPAD-events with an event counter from the plurality of event counters.

10. The time-of-flight sensor of claim 9 comprising:
a plurality of time-to-digital converter circuits; and
a global DLL configured to provide a control current to each of the plurality of time-to-digital converter circuits,
wherein a propagation delay of each delay stage is defined by the control current.

11. An apparatus comprising:
a time-of-flight sensor according to claim 10;
a camera; and
processing circuitry coupled to the time-of-flight-sensor and the camera;
wherein the processing circuitry is configured to adjust a focus of the camera and/or adapt an image taken by the camera in response to a distance to a target determined by the time-of-flight-sensor.

12. The apparatus of claim 11, wherein the apparatus is one of:
a smartphone;
a cellular telephone;
a tablet; or
a laptop.

13. A method of reducing an error in a time-to-digital converter circuit comprising a delay line, a binning circuit and a plurality of event counters, the method comprising:
configuring a trigger for a delay line to sequentially trigger a different delay stage of the delay line;
configuring the binning circuit to select an event counter from a plurality of event counters based on a signal from the delay line; and
configuring a decoder circuit to generate an offset for offsetting a selection of an event counter.

* * * * *